United States Patent [19]

Hamburgen

[11] Patent Number: 4,800,956

[45] Date of Patent: Jan. 31, 1989

[54] APPARATUS AND METHOD FOR REMOVAL OF HEAT FROM PACKAGED ELEMENT

[75] Inventor: William R. Hamburgen, Menlo Park, Calif.

[73] Assignee: Digital Equipment Corporation, Maynard, Mass.

[21] Appl. No.: 145,641

[22] Filed: Jan. 12, 1988

Related U.S. Application Data

[63] Continuation of Ser. No. 856,294, Apr. 25, 1986, abandoned.

[51] Int. Cl.$^4$ .................. F28F 13/14; H01L 23/40
[52] U.S. Cl. ............................. 165/185; 165/80.4; 361/387; 361/386; 357/81; 174/16.3
[58] Field of Search ............... 165/185, 80.4; 361/386, 361/387, 388, 389; 174/16 HS; 357/81

[56] References Cited

U.S. PATENT DOCUMENTS

| | | | |
|---|---|---|---|
| 4,226,281 | 10/1980 | Chu | 165/80.4 X |
| 4,254,431 | 3/1981 | Babuka et al. | 174/16 HS X |
| 4,381,032 | 4/1983 | Clutchaw | 165/80.4 X |
| 4,384,610 | 5/1983 | Cook et al. | 174/16 HS X |
| 4,498,530 | 2/1985 | Lipschutz | 165/185 |
| 4,587,594 | 5/1986 | McPherson | 361/383 |

FOREIGN PATENT DOCUMENTS 1197168 7/1965 Fed. Rep. of Germany ...... 361/388
0067248 4/1986 Japan ........................ 357/81

Primary Examiner—Samuel Scott
Assistant Examiner—Carl D. Price
Attorney, Agent, or Firm—William W. Holloway; David G. Pursel

[57] ABSTRACT

In order to provide thermal coupling of a package, particularly a package containing electronic components, and a heat sink, a thermal transfer assembly includes a first assembly having a group of generally parallel cooling fins coupled to the package. Coupled to the heat sink, such as cooling plate, is a second assembly also including a plurality of generally parallel cooling fins. The second set of cooling fins is positioned on the heat sink so that when the heat sink is in a predetermined position with respect to the package, the cooling fins overlap. The overlapping cooling fins permit efficient transfer of heat thus permitting heat generated in the package to be conveyed to the heat sink. The overlapping fins also permit convenient disassembly and reassembly for test and maintenance procedures. Techniques for fabrication of the thermal transfer assembly are described along with procedures for improving the operation of the heat transfer assembly. Parameters optimizing the performance of thermal transfer assembly are discussed. The individual components of the thermal transfer unit can be used separately as heat exchange units.

9 Claims, 3 Drawing Sheets

APPARATUS AND METHOD FOR REMOVAL OF HEAT FROM PACKAGED ELEMENT

This is a continuation of a co-pending application Ser. No. 856,294 filed on Apr. 25, 1986, now abandoned.

BACKGROUND OF THE INVENTION

1. Field of the Invention

This invention relates generally to the cooling of components and, more particularly, to the cooling of the electronic packages in the operating configurations.

2. Description of the Related Art

As the density of semiconductor gates or elements associated with each electronic package has increased, the solution of the problem of removal of the heat generated within the package has become increasingly difficult. The movement of gas directly over the packages has proven inadequate to maintain the packages within acceptable temperature ranges as the density of elements in the package has increased. To improve the efficiency of the heat removal, a cooling plate or other heat sink can be placed in contact with the package. When a plurality of components must be cooled, as can, for example, occur for the circuit boards of a data processing system, the use of a cooling plate frequently causes excessive stress on the packages when an attempt is made to insure that all components are in good thermal contact with the cooling plate. When physical contact between the component to be cooled and the cooling plate cannot be assured, then a gas with thermal properties superior to air can be used by placing the component and the cooling plate in an enclosed container. The cooling gas within the container, however, can become contaminated and the superior thermal properties compromised. The problem of providing good thermal contact between the plate and the package is further complicated by the need to access the electronic packages for testing or for maintenance.

Referring now to FIG. 1a, FIG. 1b and FIG. 1c, three techniques for providing removal of heat from component packages 15, according to the related art is shown. The component package is typically coupled to a circuit board 10, i.e. by solder bumps. The apparatus in each case provides for the transfer of heat from the package 45 to the cooling plate 11 via an intermediate element. The cooling plate can have additional cooling apparatus associated therewith such as apparatus for permitting a cooling liquid to flow through channels in the cooling plate. In FIG. 1a, a spring-loaded piston 12 (with spring 18) is forced into contact with the package 15. The heat must be transferred first from the package 15 to piston 12 and then from piston 12 to the cooling plate 11. In the implementation of this apparatus, a He gas atmosphere is used to improve the thermal contact between the piston 12 and the package 15 and the piston 12 and the plate 11. Simialrly, in FIG. 1b, a screw-clamped piston 13 is coupled to the cooling plate 11. In this arrangement, the screw must be adjusted during the manufacture of the component. A thermal transfer material 14 is placed between piston 13 and package 15. It will be clear that the configurations of FIGS. 1a and 1b can cause unacceptable stress to be applied to the chip.

In FIG. 1c, a spreading element 17 is coupled to the package 15 by solder material 16. The heat is transferred from the chip 15 through the solder material 16 to the spreading element 17. From the spreading element 17, the heat is transferred to the cooling plate 11.

To obtain a low thermal resistance, a gas ($H_2$) is needed to improve the thermal coupling between spreader 17 and cooling plate 11. In addition, the apparatus of FIG. 1c and the apparatus of FIG. 1b do not permit the convenient disassembly and reassembly, there being no convenient method to determine when a good thermal contact is established.

Each of these heat transfer devices described above requires a substance to improve the thermal coupling. The presence of these substances complicates the manufacture and repair of the packages and related circuits.

Referring next to FIG. 2, an apparatus for providing thermal coupling between a cooling plate 11 and a package 15 is shown. The thermal coupling apparatus includes a holder 21 for engaging a plurality of T-shaped elements 25. The holder 21 engages a spring element 26. The spring element 26 engages a structure 11A of the cooling plate. The spring element forces the T-shaped elements against the package 15. The T-shaped structures are positioned to interleave with structures 11b of the cooling plate. A major limitation of this apparatus is the effectiveness of the thermal contact between the T-shaped elements 25 and the package 15. In addition, this configuration suffers from a lack of flexibility in that the structures 11a and the structures 11b must be fabricated in the cooling plate 11 when the position of the chip has been defined.

A need has therefore been felt for apparatus and method for providing for the removal of heat from a semiconductor element that provides a good thermal coupling and can be conveniently disassembled and reassembled.

SUMMARY OF THE INVENTION

It is an object of the present invention to provide an improved apparatus and method for cooling of electronic packages.

It is another object of the present invention to provide apparatus and method for cooling an array of electronic packages.

It is a still further object of the present invention to provide apparatus and method for cooling electronic packages whereby the cooling mechanism can be easily removed from and recoupled to the electronic package.

It is yet another object of the present invention to provide apparatus and method for thermally coupling a cooling plate and a package that does not require the use of additional materials to improve the thermal transfer.

It is yet a further object of the present invention to provide a method for fabrication of heat exchange elements, elements that can be used for thermal coupling to the ambient environment.

The aforementioned and other objects are accomplished, according to the present invention, by coupling thermally a first plurality of plates or thermal transfer fins, the plates being fabricated from a material having good thermal conductivity, to a package requiring cooling. The plates of the first plurality of plates are generally positioned to be parallel to the remaining plates. A second plurality of plates or thermal transfer fins is coupled to a heat sink such as a cooling plate. The second plurality of plates is also fabricated from a material having good thermal conductivity and also has a plurality of generally parallel plates. The heat sink can be positioned relative to the electronic package so that the first plurality of plates is interleaved with the second plurality of plates. The extensive overlapping areas of the two sets of plates results in an efficient exchange of heat. Thus the heat can be conveyed from the electronic package through the first and second plurality of plates to the heat sink. The interwoven plates can be easily separated and reengaged providing for convenient testing and maintenance. An intermediate element can be placed between the sets of plates to permit flexibility in the positioning and orientation of the sets of plates. A method of fabrication of the thermal transfer fins can be used be to provide a thermal exchange element.

These and other features of the present invention will be understood upon reading of the following description along with the drawings.

Figure 1A:
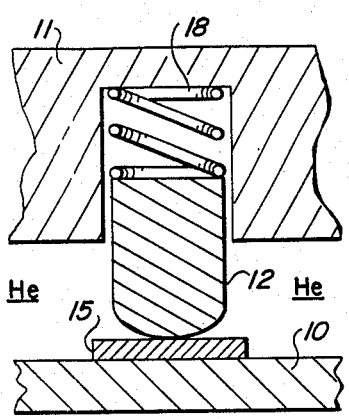
FIG. 1a, FIG. 1b and FIG. 1c illustrate related techniques for thermal coupling of a cooling plate and an electronic package.
Figure 1B:
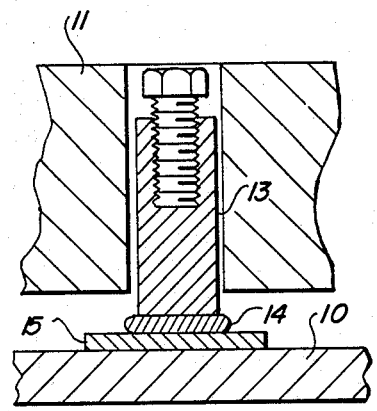
Figure 1C:
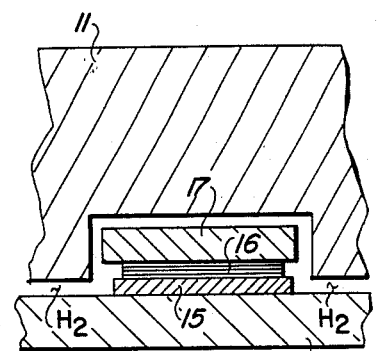
Figure 2:
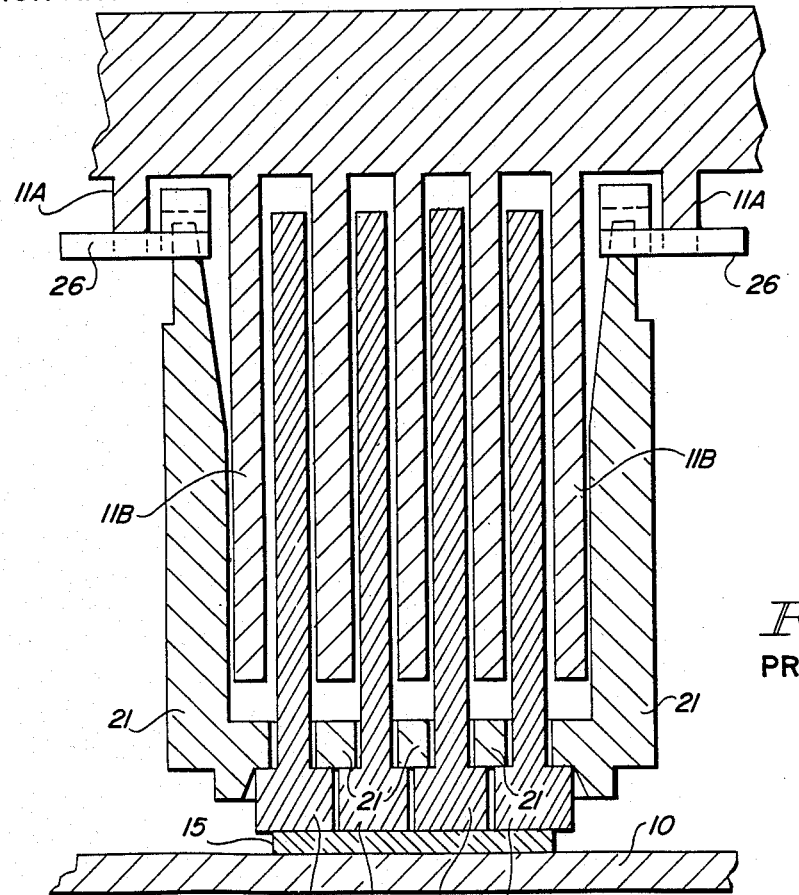
FIG. 2 shows a cross-sectional view of apparatus providing thermal coupling between a cooling plate and an electronic package according to the related art.

DETAILED DESCRIPTION OF THE PREFERRED EMBODIMENT 1. Detailed Description of the Figures FIG. 1a, FIG. b, FIG. 1c and FIG. 2 have been described with reference to the related art.

Figure 3:
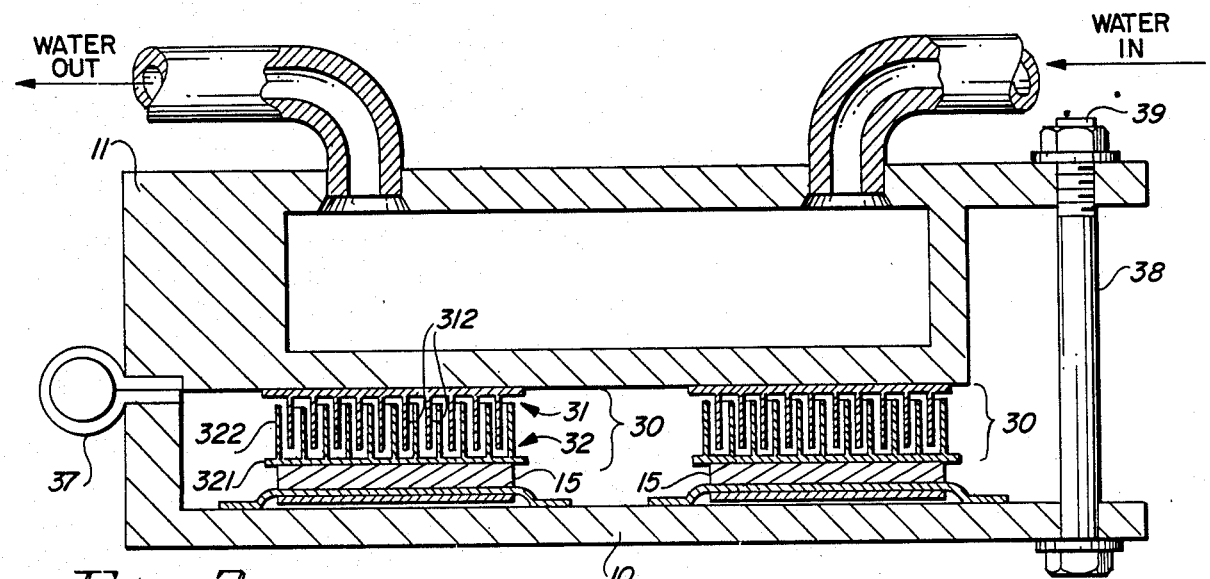
FIG. 3 is a cross-sectional view of the thermal transfer assembly for providing cooling of a package according to the present invention.

Referring next to FIG. 3, the configuration of the present invention is illustrated. The cooling plate 11 and a package 15 have a thermal transfer assembly 30 coupled there between. The thermal transfer assembly 30 includes a first or upper thermal transfer portion 31 and a second or lower thermal transfer portion 32. The first and second thermal transfer portions, 31 and 32, include a base element, 311 and 321 respectively and a plurality of planar members or thermal transfer fins, 312 and 322 respectively. The first thermal transfer portion 31 is coupled to the cool plate 11 and disposed, when the thermal transfer fins are in the operational position, opposite the semiconductor package 15 requiring cooling. Coupled to the semiconductor package 15 is the thermal transfer portion 32. The thermal transfer fins 312 and the thermal transfer fins 322 are interleaved when the cooling plate is in the operational position. The operational position is determined by positioning apparatus. In FIG. 3, two types of positioning apparatus are shown. Element 37 illustrates the use of a hinge mechanism to control the relative positions of the upper and lower portions of each heat assembly apparatus. The hinge mechanism forces the circuit board 10 and the cooling plate 11 to be rotated in and out of the interleaved position. This arrangement operates most effectively when the elements of the transfer assemblies are perpendicular to the axis of the hinge. Referring next to elements 38 and 39 of FIG. 3, the circuit board and the cooling plate can have a relative position determined by two or more guides 38. These guides can be used to move the thermal transfer fins into the operational position without causing damage to the cooling assembly.

Figure 4:
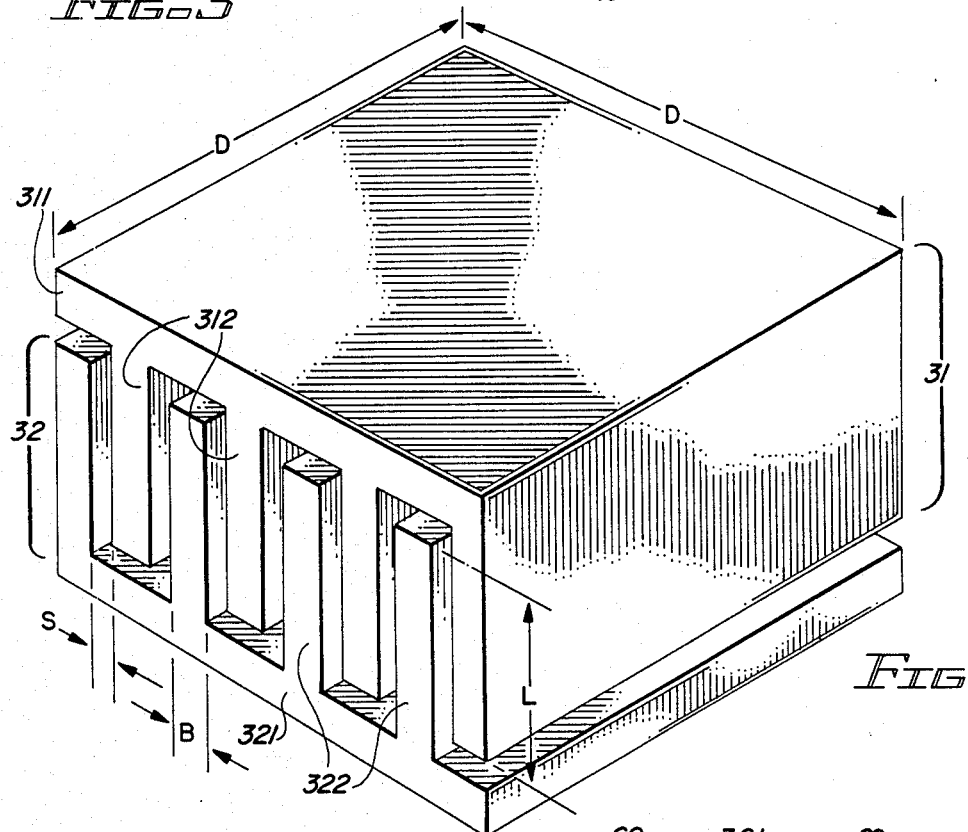
FIG. 4 is a perspective view of the thermal transfer assembly indicating various parameters used in analyzing the performance.

Referring to FIG. 4, a cooling assembly is shown along with designated dimension identifiers. For ease of discussion, certain simplifying approximations are made. For example, the length and width of the thermal transfer assembly 30 are assumed to be equal and are designated by D. Similarly, the thickness of the individual thermal transfer fins 312 and 322 of the upper assembly 31 and the lower assembly 32, respectively, are assumed to be equal and are designated by B. The upper and lower sets of thermal transfer fins are assumed to be fabricated of the same material, symmetrically disposed with respect to each other and separated by a gap designated by S. The sets of thermal transfer fins 312 and 322 overlap each other by an amount designated by L. The heat transfer between the end of the cooling fins and the base of the opposite assembly is assumed in this analysis to be unimportant. A quantitative discussion of the heat exchanges between the upper and lower assemblies can be understood, assuming a linear temperature profile along each of the the heat transfer fins, as follows. The number of plates of the cooling assembly is given by $$\text{Number of Plates} = N_P = D/(S+B) \quad (1)$$

Similarly, the number of gaps is given by $$\text{Number of Gaps} = N_G = D/(S+B) \quad (2)$$

If the thermal conductivity of the plate material is determined to be $K_P$, then the thermal resistance $r_p$ of each plate is given by $$r_P = L/K_P * B * D \quad (3)$$

If the thermal conductivity of the gap material is determined to be $K_G$, then the thermal resistance $r_G$ across each gap is given by $$r_G = S/K_G * L * D \quad (4)$$

The total thermal resistance can be approximated by $$R = R_P + R_G 32\ r_P/N_P + r_G/N_G \quad (5)$$

Combining equations (1), (2), (3), (4) and (5), then $$R = \{(S+B)/D^2\} * \{L/K_P*B + S/K_G*L\} \quad (6)$$

For a given gap S, the minimum value of R is obtained when $$L/K_P*B*D = S/K_G*D*L \quad (7)$$

$$L^2 = S*B*K_P/K_G \quad (8)$$

Therefore, using the approximations and assumptions described above, the maximum heat transfer, i.e. the least thermal resistance will occur when the length squared is equal to the width of the thermal transfer fins times the width of the gap times the ratio of the thermal conductivity of the thermal transfer fins and the thermal conductivity of the gap material. Further analysis demonstrates that, for a given value of gap spacing S, the minimum thermal resistance will occur when $S=B$.

Figure 5:
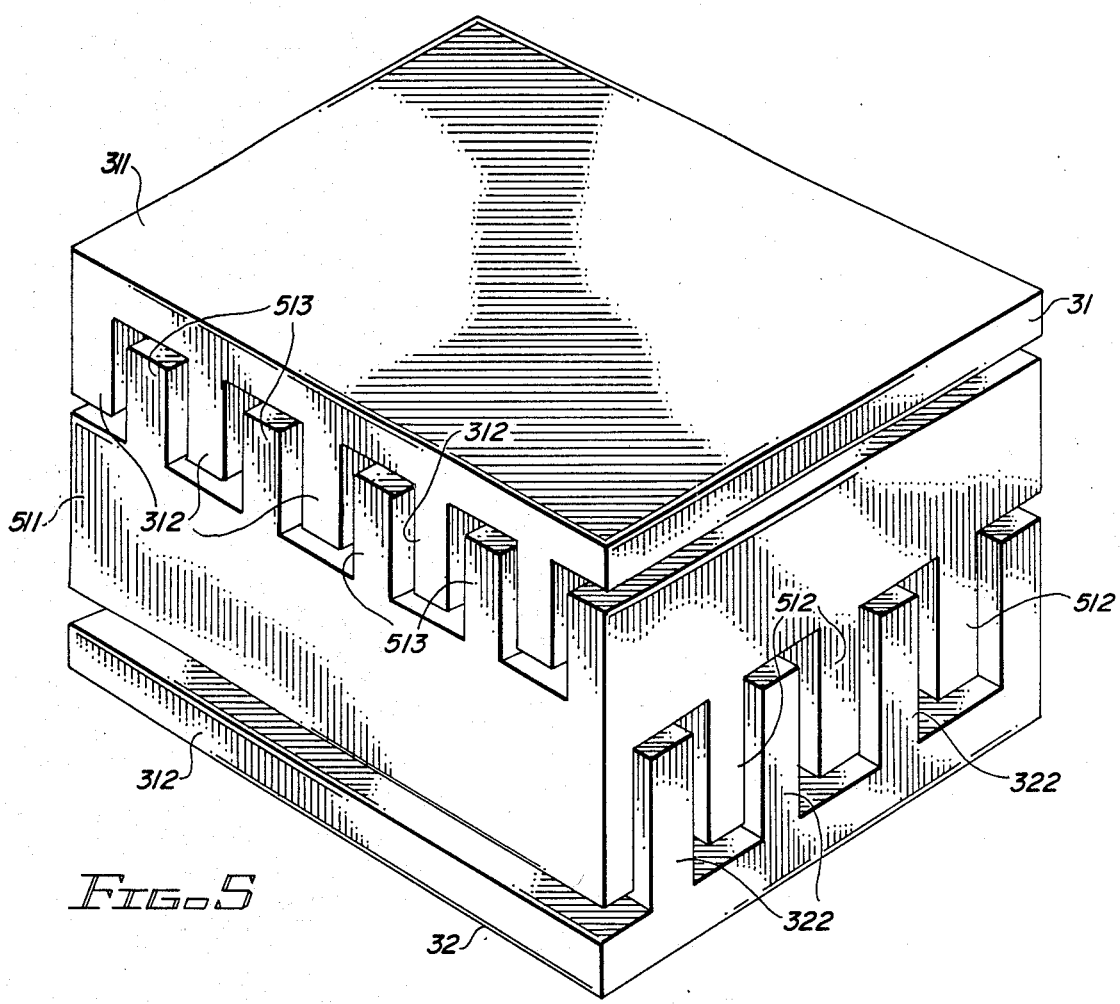
FIG. 5 is a perspective view of the cooling apparatus of the present invention illustrating the use of a coupling element for providing flexibility in the orientation and position on the cooling apparatus of the present invention.

Referring next to FIG. 5, a further advantage of the use of the thermal transfer fins attached to the electronic package and to the cooling plate is seen. In case that the thermal transfer fins (or parallel plates) do not have the proper orientation for interleaving, an intermediate coupling member 51 can be used to provide a thermal path. The coupling member 51 includes a base 511 with two sets of thermal transfer fins attached thereto. One set of thermal fins 512 is positioned to be interleaved with the thermal transfer fins 322 coupled to the cooling package, while the second set of thermal transfer fins 513 is adapted to be interleaved with the thermal transfer plates 312 coupled to the cooling plate. It will be clear that the coupling device can compensate for improper orientation, improper lateral positioning, and for extended separation between the electronic component and the cooling plate. In FIG. 5, the two groups of parallel plates are oriented at right angles to each other. It will be clear that any arbitrary angle is possible between these groups of plates. Viewed in another manner, without the intermediate coupling member 51, the interleaved groups of parallel plates permit two translational degrees of freedom, separation and motion parallel to the plates, and one rotational degree of freedom about an axis perpendicular to the interwoven plates. The intermediate coupling member permits an additional rotational degree of freedom and an additional translational degree of freedom between the groups of plates associated with the cooling package and the plates associated with the cooling plate.

Figure 6:
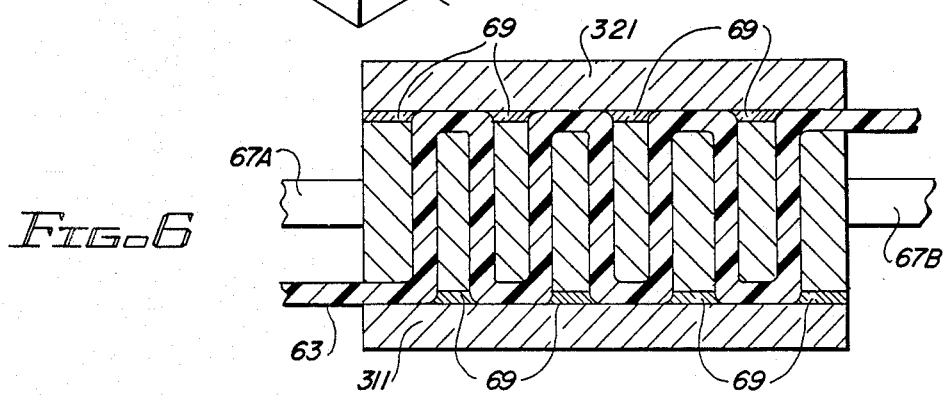
FIG. 6 is a cross-sectional view of the thermal transfer assembly illustrating the fabrication technique.

Referring next to FIG. 6, a convenient technique for the fabrication of the thermal transfer unit is illustrated. A tape material 63 having the thickness of the desired gap S between cooling fins is intertwined between the thermal transfer fins 312 and 322 of the upper and lower assemblies, respectively. The thermal transfer fins are forced against two base plates 311 and 321, held in position by a jig illustrated by elements 67a and 67b, and soldered to the base plates at solder joints 69. The base plates can be coupled to a package and to the cooling plate when the package and the cooling plate are in the operational position. The two assemblies can then be separated, the tape removed and the thermal transfer unit reassembled without the tape. Each assembly of the thermal exchange unit also can be used as a heat exchange (i.e. with the environment) unit. Because the heat exchange unit does not require the interwoven plates, the exchange units can be assembled using only the tape and not the second set of plates. In this assembly technique, the tape can extend beyond the sides of the plates, thereby permitting all of the plates to be coupled to the base element.

Figure 7:
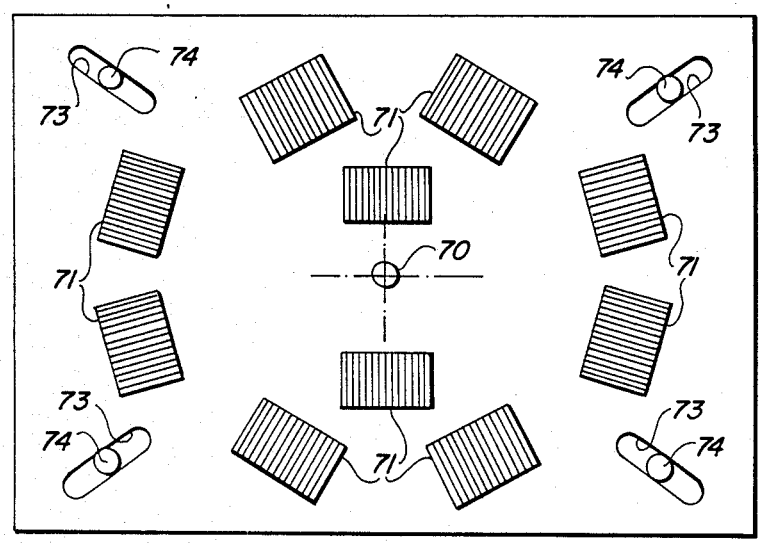
FIG. 7 is a top view of a board having a plurality of thermal transfer units coupled thereto illustrating how a difference in thermal expansion between the board and the cooling plates can be accommodated.

Referring to FIG. 7, a procedure for accommodating a difference in thermal expansion between the cooling plate and the material, such as a wiring board, to be which the packages to cooled are coupled, is illustrated. In this procedure, a point 70 on the wiring board and a similarly positioned point on the cooling plate are selected as a reference axis and the relative position of these two points is held fixed. The thermal transfer assemblies 71 are then coupled so that the cooling fins are generally parallel to the radius from the axis defined by the two points. Similarly, the guide pins 74, coupled to a board or plate with one set of the thermal transfer components, are inserted in guide slots 73 that are also parallel to the radius from reference axis 70. Thus, the relative expansion or contraction of the cooling plate and the wiring board will result in the relative motion of the upper and lower assemblies in such a manner that the cooling fins associated with each assembly will move along one of the translational degrees of freedom of the thermal transfer assembly.

Figure 8:
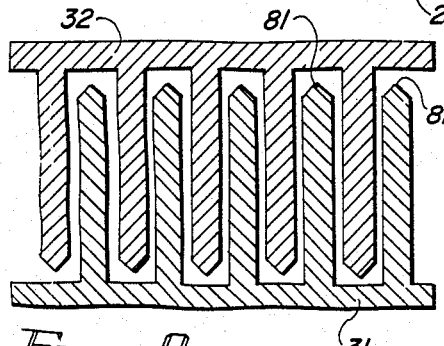
FIG. 8 illustrates a technique for facilitating the coupling of the upper and lower portions of the thermal transfer assembly.

Referring next to FIG. 8, a technique for improving the engagement of the two portions of the thermal transfer assembly is shown. When the thermal transfer fins are moved from a separated position to an interleaved position, any perturbations in the position of the thermal transfer fins may result in the contact of one or more of the thermal transfer fins with at least one thermal transfer fin of the opposite portion of the thermal transfer assembly. The width of the thermal transfer fins can result in a binding action between thermal transfer fins of each assembly. The binding action can result in the destruction of the bound cooling fins and through a domino action, result in the destruction of the thermal transfer assembly. To reduce the possibility of binding between thermal transfer fins on the separate assemblies, the ends of the thermal transfer fins are fabricated with a wedge shape. The wedge shape permits the thermal transfer fins to overlap with a minimum risk of binding.

Figure 9:
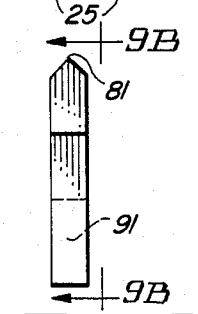
FIG. 9a and 9b are front and side views respectively of thermal transfer fins shaped to facilitate the coupling of the two portions of the thermal transfer assembly.
Figure 9B:
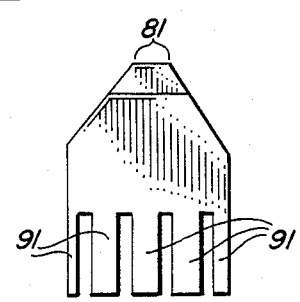

Referring next to FIG. 9a and 9b, a further improvement in the structure of the thermal fins is illustrated that facilitates the movement of the two portions of the thermal transfer assembly into the interleaved position. The shape of the thermal transfer fins are fabricated so that a reduced portion of the fins come into the vicinity of cooling fins of the opposite assembly portion during initial engagement. In the event of contact between opposite assembly portion thermal transfer fins, the shape of the thermal transfer fins can cause the contacting portions of the thermal transfer fins to slide past each other, thereby reducing the chances for destructive binding of the thermal transfer fins. Although the narrow region shown as 81 in FIG. 9b has a finite length, it will be clear that the thermal transfer fin can be pointed. It will also be clear that the shape illustrated in FIG. 9a and 9b can be combined with the wedge-shaped end shown in FIG. 8 for the thermal transfer fins.

FIG. 9b also indicates a further improvement of the present invention important for certain applications. In this improvement, the cooling fins have portions 91 (indicated by dotted lines) removed from the bottom of the cooling fins. These removed portions may be utilized when the base element and the cooling fins are fabricated from different materials and have thermal expansion coefficients sufficiently different to compromise the coupling between cooling fins and the base element. The removed portions 91 provide for the integrity of the coupling despite the differing thermal expansion coefficients. (The base element material may be chosen to be consistent with the thermal expansion coefficient of the package material or whatever material to which the base element is coupled).

2. Operation of the Preferred Embodiment

With respect to the analysis given for FIG. 4, a more complete analysis, which confirms the original calculations upon which the invention was developed, results in $$R_{EXACT} 32\ L*(S+B)*Q/K_P*B*D^2 \quad (9)$$

where
$$Q\ 32\ [1+2*(1+\cosh w)/w\sinh w] \quad (10)$$

and
$$w^2 = 4*L^2*K_G/K_P*S*B \quad (11)$$

Equation (6) and equation (9) yield thermal resistances that are within 20% of each other for any value of the parameters. As an example of typical values, when S=69 um, B=69 um, D=14.14 mm, L=7.38 mm and the thermal conductivities for copper and air are used, then R=0.439 ° C/W, while $R_{EXACT}$=0.500° C/W.

Other features of the heat transfer assembly can be understood by substituting typical values in the foregoing equations. For example, relatively small departures from the optimum length of the thermal transfer fins result in small changes from the optimum value of R, i.e. the thermal resistivity. Therefore, extreme accuracy in the implementation of the length of the thermal transfer fins is not required. However, the tapering configuration shown in FIG. 9b can affect the value of the thermal resistivity of the thermal transfer assembly. The foregoing analysis has been based on the assumption that the thermal transfer fins for each assembly are symmetrically positioned with respect to the thermal transfer fins of the other assembly, i.e. the gap S is equal for the whole assembly. Analysis shows that any departures from the symmetrical gap S results in decreased thermal resistivity. In the limiting case where S=O, i.e. the thermal transfer fins are touching, the lowest resistivity can be achieved.

Although the foregoing descriptions has been given in terms of the cooling of electronic components, it will be clear that the present invention can be used advantageously to maintain any type of component within a predetermined temperature range either by heating or by cooling the component. In addition, because the individual components of the thermal transfer units can be used as heat exchange elements for transfer for coupling to the environment, the process for manufacturing the thermal transfer units can be used to manufacture the individual heat exchange units. This manufacturing process can produce heat exchange units of dimensions that would be difficult to fabricate by ordinary machining or casting techniques. In addition, the cooling fins can be mounted directly on the component or package to be cooled, the component or package then acting as the base element for the cooling fins.

It will also be clear that the foregoing discussion will also be valid for cooling structures implemented by interleaved pins or brushes. These pins or brushes can be implemented to approximate the planar structure of the cooling fins described above or can be implemented to have a different structural organization.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. Apparatus for transferring heat from a component package to a cooling plate, said apparatus comprising:
   a first plurality of generally parallel planar members coupled to said component package;
   a second plurality of generally parallel planar members coupled to said cooling plate, said first and said second planar members having good thermal conductivity, said first and said second plurality of planar elements generally aligned along an axis and separated; and
   coupling apparatus thermally coupling said first and said second plurality of planar members, said coupling apparatus including,
   a base,
   a third plurality of generally parallel planar members coupled to said base, and
   a fourth plurality of generally parallel planar members coupled to said base, said third plurality of planar members generally being interleaved with said first plurality of planar members and said fourth plurality of planar members generally being interleaved with said second plurality of planar elements when said coupling apparatus is in an operative configuration.

2. The apparatus of claim 1 wherein the length L of the overlap of the planar members is approximately determined by the relationship $$L^2 = S*B*K_P/K_G$$

where S is the gap between planar members, B is the thickness of the planar members, $K_P$ is the thermal conductivity of the planar members and $K_G$ is the thermal conductivity of the material between the planar materials.

3. The apparatus of claim 2 wherein said planar members have a tapered edge on an edge generally parallel to an edge coupled to said base.

4. The apparatus of claim 2 wherein an outer edge of said planar members has an edge narrower than a width of said planar member.

5. The apparatus of claim 1 wherein said component coupled to a board, wherein said board and said cooling plate are connected at a first and a second position of an axis generally perpendicular to said board and said cooling plate, wherein said first plurality of planar members are aligned generally parallel to a radius from said first position and said second plurality of planar members are aligned generally parallel to a radius from said second position.

6. The thermal transfer unit for thermally coupling a plurality of generally parallel cooling fins associated with a heated element and a plurality of generally parallel fins associated with a heat sink comprising:
   an exchange unit, wherein said heat exchange unit includes;
   a base element; and
   a first plurality of substantially parallel fins and a second plurality of substantially parallel fins, said first and second plurality of fins being coupled generally perpendicular to and on opposite sides of said base element, said first and said cooling plurality of fins along with said second and said heat sink plurality of fins being generally interleaved when said thermal transfer unit is in an operational relationship.

7. The thermal transfer unit of claim 4 wherein the length L of the overlap of fins is approximately determined by the relationship $$L^2 = S \cdot B \cdot K_P / K_G$$

where S is the gap between fins, B is the thickness of said fins, $K_P$ is the thermal conductivity of said fins and $K_G$ is the thermal conductivity of the material between said fins.

8. The thermal transfer unit of claim 4 wherein said first plurality of fins of a plurality of thermal transfer units are each coupled to a different heated element, each of said heated elements coupled to a planar body having a reference axis, wherein said first plurality of parallel fins are generally parallel to a radius from said reference axis to said heated element.

9. The thermal transfer unit of claim 4 wherein said fins are tapered at an extended edge of said fins generally parallel to an edge coupled to said base.

* * * * *